United States Patent [19]

Nakase

[11] Patent Number: 4,821,234
[45] Date of Patent: Apr. 11, 1989

[54] SEMICONDUCTOR MEMORY DEVICE

[75] Inventor: Yasunobu Nakase, Hyogo, Japan

[73] Assignee: Mitsubishi Denki Kabushiki Kaisha, Tokyo, Japan

[21] Appl. No.: 46,788

[22] Filed: May 7, 1987

[30] Foreign Application Priority Data

May 13, 1986 [JP] Japan ................................ 61-111309

[51] Int. Cl.$^4$ .............................................. G11C 11/40
[52] U.S. Cl. .................................... 365/203; 365/189; 365/206; 365/230
[58] Field of Search ............... 365/189, 184, 203, 206, 365/207, 230

[56] References Cited

U.S. PATENT DOCUMENTS 4,393,476  7/1983  Ong .

OTHER PUBLICATIONS

*ISSCC,* Feb. 24, 1983, "A 15ns 16Kb ECL RAM with a PNP Load Cell", by Kazuhiro Toyoda et al.
*ISSCC,* Feb. 20, 1986, "A 3.5ns, 2W, 20mm$^2$ 16Kb ECL Bipolar RAM", by Kunihiko Yamaguchi et al.

*Primary Examiner*—Terrell W. Fears
*Attorney, Agent, or Firm*—Lowe, Price, Leblanc, Becker & Shur

[57] ABSTRACT

When a pair of word lines 1 and 2 change from a selected state to a non selected state, a word line discharging circuit 10 enables a transistor 15 to conduct during a period when this pair of word lines 1 and 2 are maintained at the highest potential compared with the other pairs of word lines, so that the pair of word lines 1 and 2 are discharged by means of a first discharging current source 11. The word line discharging circuit 10 enables a transistor 16 to conduct after another pair of word lines attain the highest potential, so that the pair of word lines 1 and 2 are discharged by means of a second discharging current source 12.

3 Claims, 3 Drawing Sheets

SEMICONDUCTOR MEMORY DEVICE

BACKGROUND OF THE INVENTION

1. Field of the Invention

The present invention relates to a semiconductor memory device and particularly to a semiconductor memory device in which a word line discharging circuit is improved.

2. Description of the Prior Art

FIG. 1 is a block diagram showing a portion of a conventional semiconductor memory device. In FIG. 1, there are provided a plurality of pairs of word lines, each pair being formed by a positive word line 1 and a negative word line 2, and there are also provided a plurality of pairs of bit lines, each pair being formed by a bit line 3 and a bit line 4. Memory cells 5 are connected at the respective points of intersection between the pairs of word lines and the pairs of bit lines. The memory cells 5 are selected by the pairs of word lines and the pairs of bit lines to store and read out information. A word line drive circuit 6 is connected to each positive word line 1. This word line drive circuit 6 drives the related positive word line 1 to be at a high potential when it is selected and drives it to be at a low potential when it is not selected. On the other hand, a current source 7 (the constant current value thereof being hereinafter represented as IH) is connected to each negative word line 2. The current source 7 stores and holds contents of the memory cells 5. The negative word lines 2 are connected to a current source 9 (a constant current value thereof being hereinafter represented as IDC) for discharging a word line through the respective diodes 8. The diodes 8 and the current source 9 constitute a word line discharging circuit 10.

If a certain pair of word lines changes from a selected state to a non selected state, another pair of word lines changes from a non selected state to a selected state. At this time, if a potential of the word lines changing from the selected state to the non selected state falls slowly, the word lines are temporarily brought into a double selected state. As a result, if information is to be read out, a delay is caused in detection of stored information to be read out and if information is to be written, the information is written in the memory cell selected immediately before that change, causing erroneous operation. Therefore, for the purposes of reading out information at high speed and preventing erroneous writing, the potential of the word lines changing from the selected state to the non selected state need to fall rapidly.

In the word line discharging circuit 10 shown in FIG. 1, the word line having the highest potential among the plurality of negative word lines 2 is connected to the current source 9 through the related diode 8. A word line 1 of a pair including the negative word line 2 having the highest potential is in a selected state. Consequently, if a certain pair of word lines changes from a selected state to a non selected state, the negative word line 2 of this pair is connected with both the current sources 7 and 9 and this word line 2 is discharged by current of IH + IDC. As a result, the potential of the word line falls rapidly.

However, the word line discharging circuit 10 shown in FIG. 1 involves the below described disadvantage because a discharging path is formed only for the negative word line 2 at the highest potential.

FIG. 2 shows changes in potential of a negative word line changing from a selected state to a non selected state and that of another negative word line changing from a non selected state to a selected state, the abscissa representing time and the ordinate representing potential of the negative word line. In FIG. 2, the line 21 shows potential of the negative word line changing from the selected state to the non selected state and the line 22 shows potential of the negative word line changing from the non selected state to the selected state. With respect to the point Q where the potentials of the negative word lines represented as the lines 21 and 22 are conincident, the potential of the negative word line represented as the line 21, changing from the selected state to the non selected state is no longer the highest potential after the point Q and the discharging current thereof changes from IH + IDC to simply IH. Accordingly, the line 21 falls slowly after the point Q as shown by the broken lines in FIG. 2 and the time of the double selected state of the word line continues long. After the point Q, the discharging current IDC is supplied through the negative word line 2 changing from the non selected state to the selected state.

Thus, although the word line discharging circuit 10 is provided in the circuit shown in FIG. 1, this word line discharging circuit 10 can only perform its function effectively till the point Q and after that the discharging speed is slowed down and the potential of the word line cannot be lowered rapidly.

As other prior art of interest to the present invention, the following documents (1) to (3) are known.

(1) U.S. Pat. No. 4,393,476

(2) ISSCC Dig. of Tech. Paper pp. 108–109, 1983 "A 15ns 16kb ECL TAM with a PNP Load Cell" by Kazuhiro Toyoda et al.

(3) ISSCC Dig. of Tech. Paper pp. 214–215, 1986 "A 3.5ns, 2W, 20mm$^2$ 16kb ECL Bipolar RAM" by Kunihiko Yamaguchi et al.

In the prior art document (1), there are provided, in addition to a current source for discharging of word lines, current sources for the respective word lines for the purpose of preventing saturation of the discharging transistors and, therefore, the circuit has a complicated configuration and a large size and the manufacturing cost thereof is high. In addition, since the current source provided for each word line is supplied with current from the word line through a diode, its operative range to power supply voltage is limited by a voltage drop in the diode.

According to the prior art documents (2) and (3), a word line discharging circuit is formed by capacitors C and resistors R in either document so that a prescribed amount of current is removed from a word line within a period of time determined by a time constant of CR when the word line concerned is in a non selected state. However, since the capacitance of the time constant circuit in either of those documents (2) and (3) is formed as a junction capacitance of a semiconductor device, it is difficult to set the capacitance to a certain value and the discharging time becomes too long or too short. In addition, there is another disadvantage that a large area is required to obtain a certain capacitance value, causing a semiconductor memory device to be large-sized.

SUMMARY OF THE INVENTION

The present invention has been accomplished to overcome the disadvantages of the above cited prior art documents, and it is an object of the present invention to provide a semiconductor memory device capable of discharging word lines at high speed till the potential of the word lines is completely brought into a non selected state.

Briefly stated, a semiconductor memory device of the present invention comprises two current sources for discharging word lines, so that, when a word line changes from a selected state to a non selected state, a discharging path is formed toward the first current source during the first half of the period of the change and a discharging path is formed toward the second current source during the second half thereof. More specifically, in the word line changing from the selected state to the non selected state, electric charge is removed therefrom by the second word line discharging current source even after the other word lines are set to the highest potential.

According to the present invention, large current can be discharged from a word line which changes from a selected state to a non selected state, till the potential of the word line is completely set in the non selected state. Consequently, the potential of the word line can be made to fall at high speed and, as a result, reading operation can be performed at high speed and erroneous operation in writing can be prevented.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
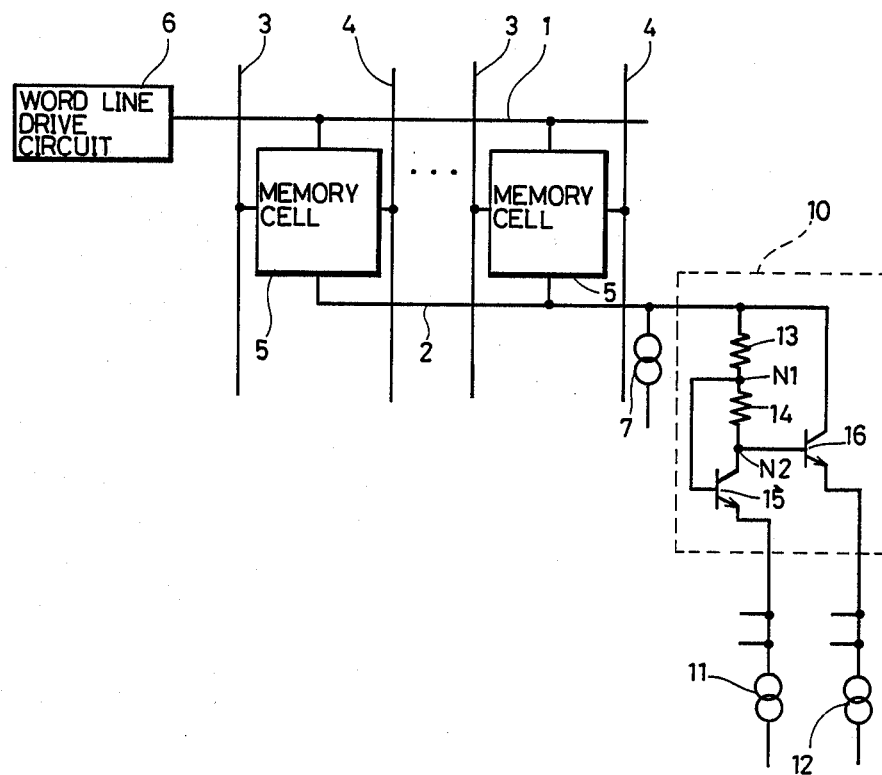
FIG. 3 is a circuit diagram showing an embodiment of the present invention.

FIG. 3 is a circuit diagram showing an embodiment of the present invention. It is to be noted in FIG. 3 that although construction associated with only a pair of word lines is shown for the purpose of simplification, construction related with other pairs of word lines is the same as shown FIG. 3.

Figure 1:
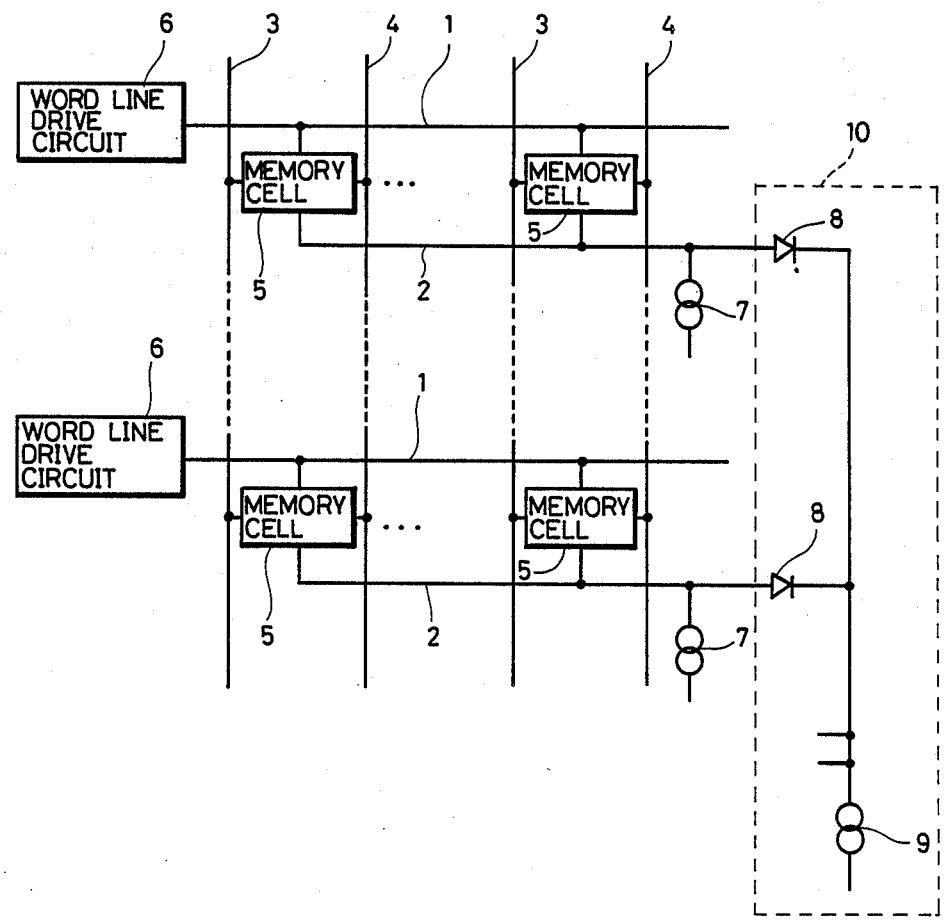
FIG. 1 is a block diagram showing an example of a conventional semiconductor memory device.

In FIG. 3, the positive word line 1, the negative word line 2, the bit lines 3, the bit lines 4, the memory cells 5, the word line drive circuit 6 and the current source 7 which serves to hold the stored content are similar to those shown in FIG. 1. Characteristic features of this embodiment are that there are provided two current sources 11 and 12 for discharging word lines and that a word line discharging circuit 10 is provided in connection with each negative word line 2. The first discharging current source 11 and the second discharging current source 12 are provided commonly in association with the negative word lines 2 and the word line discharging circuit 10 is provided for each negative word line 2.

The word line discharging circuit 10 comprises resistors 13 and 14 and transistors 15 and 16. The resistors 13 and 14 are connected in series and they are disposed between the negative word line 2 and the collector of the transistor 15. A point of connection between the resistors 13 and 14 is connected to the base of the transistor 15. The emitter of the transistor 15 is connected to the first discharging current source 11. The collector of the transistor 16 is connected to the negative word line 2; the base thereof is connected to the collector of the transistor 15; and the emitter thereof is connected to the second discharging current source 12.

In the above described construction, the transistor 15 is conducted during the first half of a period of change in the associated pair of word lines from the selected state to the non selected state (namely, before the point Q shown in FIG. 2) so that the discharging path is formed in association with the first discharging current source 11. On the other hand, the transistor 16 is conducted during the second half of the period of the change (namely, after the point Q in FIG. 2) so that the discharging path is formed in association with the second discharging current source 12. Thus, the negative word line 2 is discharged by either of the current sources 11 and 12 till the potential thereof completely attains the potential in the non selected state.

Further detailed description of the operation of this embodiment will be given in the following. Hereinafter, the constant current value of the current source 7 is represented as IH; the constant current value of the first discharging current source 11 is represented as IDC1; the constant current value of the second discharging current source 12 is represented as IDC2; the resistance value of the resistor 13 is represented as R1; the resistance value of the resistor 14 is represented as R2. For the purpose of clarifying change of potential in the word line discharging circuit 10, the point of connection between the resistors 13 and 14 is represented as a node N1 and the point of connection between the resistor 14 and the collector of the transistor 15 is represented as a node N2.

Now, assuming that the pair of word lines shown in FIG. 3 change from the selected state to the non selected state, discharging operation at the positive word line 1 of this specified pair will be described. As described previously in connection with FIG. 2, the potential of the negative word line 2 of the specified pair is the highest potential compared with the negative word lines 2 of the other pairs and accordingly the node N1 concerned is at the highest potential compared with the nodes N1 associated with the other word line discharging circuits 10. As a result, the base potential of the transistor 15 of this specified pair is highest compared with the base potentials of the respective transistors 15 associated with the other pairs, and the transistor 15 of this specified pair is conducted. Thus, in this specified pair of word lines, the discharging path is formed in association with the first discharging constant current source 11. In this case, if the discharging current IDC1 is sufficiently large, the base potential of the transistor 15 of the specified pair, namely, the potential of the node N1 is lowered to a potential equal to the potential of the nodes N1 in the respective word line discharging circuits 10 of the other pairs in the non selected state. At this time, the potential at the nodes N1 in the respective discharging circuits 10 of the other pairs in the non selected state are almost equal to the potential of the negative word line 2 of the specified pair. In the other pairs, the potential at the respective nodes N2, namely, the base potential of the respective transistors 16 are almost equal to the potential of the non selected negative word lines 2 as in the case of the nodes N1 since the transistors 15 of the respective discharging circuits 10 of the other pairs are not conducted. On the other hand, in the specified pair, the transistor 15 is conducted so that the discharging current IDC1 flows in the transistor 15. As a result, the base potential of the transistor 16 is lowered from the potential at the node N1 to IDC1 × R2 [V]. Consequently, since the base potential of the transistor 16 in the specified pair becomes lower than the base potential of the respective transistors 16 in the other pairs, the transistor 16 in the specified pair is not conducted. Thus, a discharging path is not formed in association with the second discharging current source 12.

Figure 2:
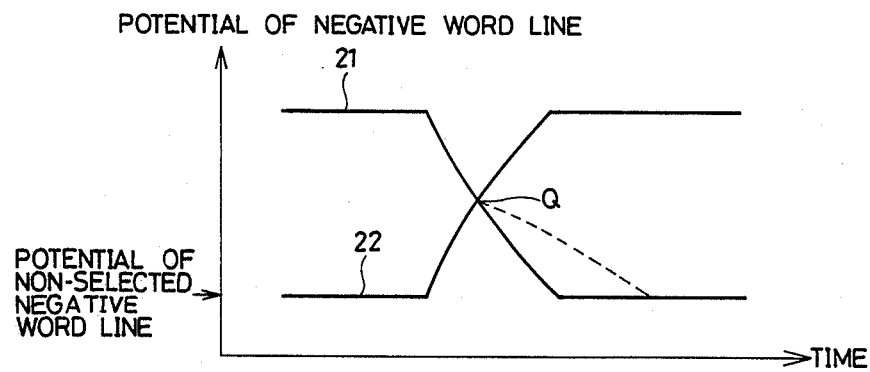
FIG. 2 is a graph showing changes in potential of negative word lines in an embodiment of the present invention and in the conventional circuit.

The above described operation is maintained till the point Q shown in FIG. 2 so that the negative word line 2 of the specified pair is discharged by the first discharging current source 11. If the discharging IDC1 is not sufficiently large, the potential at the node N2 in the specified pair does not become lower than the potential at the respective nodes N2 in the other pairs in the non selected state and accordingly operation after the point Q to be described below is not performed. For this reason, the constant current value of the first discharging current source 11 is selected to be sufficiently large and the resistance values of the resistors 13 and 14 are selected to be suitable values.

After the point Q, the potential of the negative word line 2 of the specified pair becomes the second highest potential compared with the other pairs. It is a negative word line 2 changing from the non selected state to the selected state in the other pairs that becomes the highest potential. Among the word line discharging circuits 10 associated with the respective pairs, it is the transistor 15 connected with the negative word line 2 at the highest potential that supplies the discharging current to the first discharging constant current source 11. Therefore, the transistor 15 associated with the negative word line 2 in this specified pair does not conduct. As described above, the node N2 connected with the negative word line 2 at the highest potential becomes lower than the potential of the non selected word lines and accordingly the node N2 in the word line discharging circuit 10 of the specified pair becomes the highest potential compared with the respective nodes N2 of the other pairs. Accordingly, the transistor 16 is conducted so that the discharging path is formed in association with the second discharging current source 12. After that (after the point Q), the above described operation is maintained till the potential of the negative word line of the specified pair becomes equal to the potential of the non selected word lines, and thus the negative word line 2 of the specified pair is discharged by the discharging current IDC2 from the second discharging current source 12.

Thus, in the above described embodiment, large discharging current is removed from the negative word line 2 by the second discharging current source 12 even after the point Q and consequently the potential of the word line changing from the selected state to the non selected state can be rapidly lowered.

Although the resistors 13 and 14 are provided between the negative word line 2 and the collector of the transistor 15 in the above described embodiment, a diode may be provided instead of the resistor 13 or 14. In such a case, forward voltage drop of the diode is applied.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of pairs of word lines, each pair of said plurality of word lines including a positive word line and a negative word line; a plurality of pairs of bit lines, and a plurality of memory cells connected at intersections between respective pairs of said plurality of pairs of word lines and respective pairs of said plurality of pairs of bit lines, each of said pairs of word lines operable selectively in a selected state and in a non-selected state responsive to a select signal, a transition of said select signal from said selected state to said non-selected state defining a discharge period, said semiconductor memory device comprising:

a first discharging current source, a second discharging current source, and a plurality of word line discharging circuits, each of said plurality of word line discharging circuits connected to a corresponding negative word line of said plurality of pairs of word lines, and operable in response to a first voltage level on said negative word line to connect said corresponding negative word line to said first discharging current source for discharging said negative word line during a first portion of said discharge period, and operable in response to a second voltage level on said negative word line to connect said corresponding negative word line to said second current source during a remaining portion of said discharge period, each of said plurality of word line discharging circuits comprising:

first and second resistance means connected in series, a first transistor having a collector connected to said corresponding negative word line through said first and second resistance means, a base connected to a point of connection between said first and second resistance means, and an emitter connected to said first discharging current source, and a second transistor having a collector connected to said corresponding negative word line, a base connected to said collector of said first transistor, and an emitter connected to said second discharging current source.

2. A semiconductor memory device in accordance with claim 1, wherein said first and second resistance means are resistance elements.

3. A semiconductor memory device in accordance claim 1, wherein said first and second resistance means are diodes.

* * * * *